WITNESSES
Edwin E. Bassler
James F. Young

INVENTORS
Larry J. Pollock and
Wallace N. Shaunfield
BY
Gordon H. Telfer
ATTORNEY United States Patent Office 3,441,815
Patented Apr. 29, 1969

3,441,815

SEMICONDUCTOR STRUCTURES FOR INTEGRATED CIRCUITRY AND METHOD OF MAKING THE SAME

Larry J. Pollock, Odenton, Md., and Wallace N. Shaunfield, Richardson, Tex., assignors to Westinghouse Electric Corporation, Pittsburgh, Pa., a corporation of Pennsylvania Continuation-in-part of application Ser. No. 379,961, July 2, 1964. This application Sept. 14, 1966, Ser. No. 579,418
Int. Cl. H01l 19/00, 11/06
U.S. Cl. 317—235 7 Claims

ABSTRACT OF THE DISCLOSURE

A diode structure particularly for use in integrated circuits is provided of two regions that are both highly doped of which one may be formed by a region diffused at the same time as integrated circuit isolation walls rather than at the time of transistor base diffusion. The second diode region may be formed at the time of the transistor emitter diffusion. Device characteristics include those desirable for the diodes used in the base circuit of a fast switching transistor in DTL integrated circuits.

This application is a continuation-in-part of application Ser. No. 379,961, filed July 2, 1964, now abandoned.

This invention relates generally to semiconductor devices such as integrated circuits where the functions of a plurality of individual, conventionally interconnected, components are provided within a unitary body of semiconductive material. In its more specific aspects the invention relates to diode structures in integrated circuits, whether such diode structures are employed for use as active diodes or as capacitors in the integrated circuit.

At present, capacitor structures in integrated circuits are diode structures usually formed by successive diffusions of opposite type impurities into a pocket of isolated material.

The first diffusion for the diode structure is performed at the time of the base diffusion in transistor structures and hence has a relatively low surface concentration of the order of about $10^{18}$ atoms per cubic centimeter. In such structures the capacitance provided per unit area is undesirably small, typically about 0.5 picofarad per square mil. Hence, for the provision of a capacitor of large capacitance an undesirable amount of the area and volume of the integrated circuit must be devoted to the capacitor structure.

It is also the case that double diffused capacitor structures as just described exhibit distributed RC effects, apparently because of the relatively high resistivity of the underlying, first diffused, region. The structure therefore operates as a tuned circuit element whose capacitance is strongly frequency dependent and which exhibits a poor pulse response.

Another problem is that of providing slow recovery diode structures in integrated circuits. By a slow recovery diode is meant one that requires a relatively long time for a change from forward to reverse bias across the p-n junction following a change of polarity of applied potential. In the present context, a slow recovery diode requires about 50 nanoseconds for recovery while a fast recovery diode requires about 3 nanoseconds.

In a typical integrated circuit intended for performance of a logic function, it is generally desirable that the overall circuit function be performed in as short a time as possible. There are instances however when the rapid performance of individual component functions causes the overall circuit function to require a longer time. This is the case, for example, with diodes in the base circuit of a switching transistor.

To speed up circuit performance in present structures there is frequently performed a diffusion of the entire structure with a metal that interstitially diffuses through the semiconductor crystal lattice. Gold is frequently used for this purpose as it has the function of killing carrier lifetime in a semiconductor structure so that storage effects are minimized. Use of gold diffusion makes provision of slow recovery diodes very difficult by previous techniques.

It is also desirable in structures for performing as active diodes to have a high forward conductance for the best combination of noise immunity and for high turn-on transconductance giving a fast rise time. A further desirable feature is that the diode structure be one whose characteristics are not appreciably affected by temperature variation.

It is therefore an object of the present invention to provide improved diode structures, particularly for integrated circuits, having a high capacitance per unit area, a good pulse response and low frequency dependence.

Another object is to provide a diode structure having a high forward voltage drop at low current level with minimum reduction of the forward voltage drop with temperature increase.

Another object is to provide an integrated circuit structure including a slow recovery diode and also fast diodes or fast transistors.

Another object is to provide diode structures having a high transconductance at turn-on and little temperature sensitivity.

Another object is to provide a method of fabricating a semiconductor integrated circuit including a diode structure suitable for operation as a slow recovery diode or as a capacitor having high capacitance per unit area.

The invention, in brief, achieves the above-mentioned and additional objects and advantages in an integrated circuit where a diode structure is provided of two regions that are both highly doped. The first diffused diode region is formed at the time of isolation walls in the structure and not transistor base regions. It has been found that the diode structure has a higher capacitance and will operate as a slow recovery diode even though the integrated circuit is gold diffused to kill carrier lifetime.

The present invention, together with the above-mentioned and additional objects and advantages thereof, will be better understood by referring to the following description together with the accompanying drawing, wherein.

Figure 1:
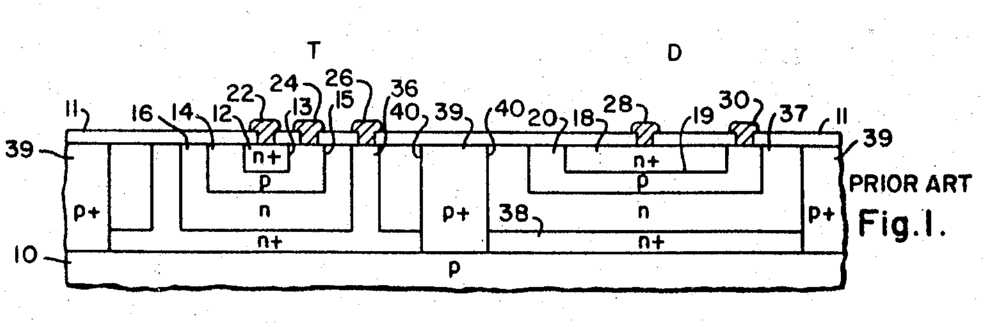
PRIOR ART Fig. 1.
FIGURE 1 is a partial, sectional view of an integrated circuit in accordance with the prior art.

Referring now to FIG. 1, there is illustrated a structure that provides the function of a transistor, T, and a diode, D, that are effectively electrically isolated but physically united. A p-type substrate 10 serves as a support for the regions that make up the active portions of the devices and assists in providing electrical isolation. The transistor structure is provided by the regions 12, 14 and 16 of alternate semiconductivity type with p-n junctions 13 and 15 serving as the emitter and collector junctions, respectively. The region 36 of more highly doped n-type material adjacent the collector region 16 cooperates to form a part of the collector and aids in achieving a low collector saturation resistance. Contacts 22, 24 and 26 for the emitter, base and collector are disposed on the regions 12, 14 and 36, respectively.

The diode structure is made up of the regions 18 and 20 of opposite semiconductivity type having the p-n junction 19 therebetween. Contacts 28 and 30 to the cathode and anode of the diode are provided on the regions 18 and 20, respectively. A p+ wall 39 extends from the substrate 10 to the upper surface of the device to assist in achieving electrical isolation. The wall 39 forms a p-n junction 40 with isolated n-type regions 16 and 37 in which the active devices are fabricated. In the diode portion of the structure the region 37 is a passive region as is the n+ region 38. A surface passivating layer 11 extends over the upper surface for electrical passivation and protection of the termination of the p-n junctions.

Figure 2:
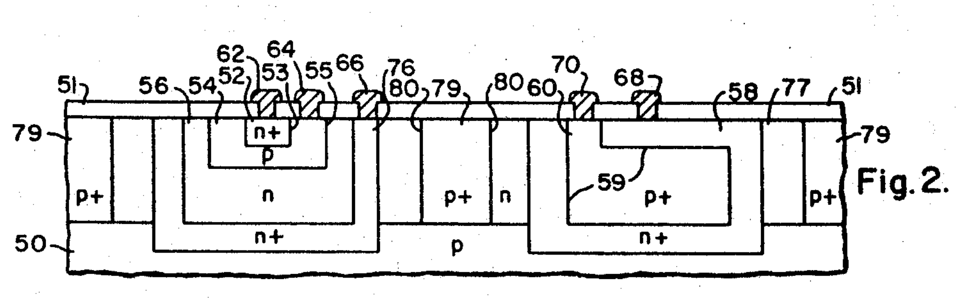
FIG. 2 is a partial, sectional view of an integrated circuit in accordance with the present invention.

Referring to FIG. 2, an example of an improved structure in accordance with this invention is illustrated. Elements of the structure of FIG. 2 are designated by reference numerals that exceed those designating corresponding elements of the structure of FIG. 1 by 40. In FIG. 2, the portion of the structure providing transistor functions is very much like that illustrated in FIG. 1 with the exception of the lower part of the region 76 that is now provided as a region within the surface of the substrate 50 rather than as a layer disposed thereon.

The portion of the structure providing diode functions differs from that illustrated in FIG. 1 in that the cathode 58 is a region that completely surrounds the anode 60 except for a small exposed surface portion available for contacting. Also, the anode 60 is a p+ region, that is highly doped to a similar extent as the cathode 58. The diode structure and diode junction 59 provides a considerably higher capacitance per unit area of substrate than is available from a structure as illustrated in FIG. 1 due to the higher impurity concentrations on both sides of the junction 59. The high doping on both sides of the junction 59 will also provide a high forward conductance with the attendant advantages mentioned in the introduction.

The structure of FIG. 2, when utilized in actual integrated circuits was found to provide other advantages that are not explainable solely by an increase in capacitance in the diode region. It has been found that diodes made as shown in FIG. 2 have a long recovery time from forward to reverse bias conditions even when the structure has been gold diffused.

This unexpected advantageous operation of the structure in accordance with this invention permits additional flexibility in the design of integrated circuits. This feature particularly is advantageous in the fabrication of certain integrated circuits where it is desired to provide fast switching transistors and slow recovery diodes of which the structure illustrated in FIG. 2 is an illustrative example.

The advantageous structures in accordance with this invention may be readily fabricated by techniques that are compatible with those conventionally employed in integrated circuit fabrication. That is, the fabrication of improved diode structures in accordance with this invention may be performed simultaneously with the fabrication of structures for the performance of other electronic functions in other portions of an integrated circuit.

Figure 3A:
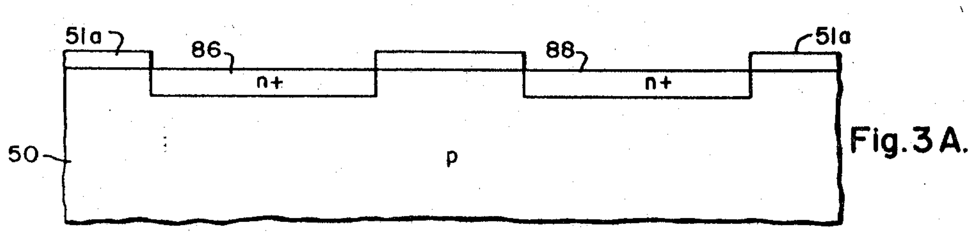
FIGS. 3A through 3G are partial, cross-sectional views of a semiconductor structure illustrating successive stages in the fabrication of a structure like that shown in FIG. 2.

FIGS. 3A through 3G illustrate the practice of the present invention to fabricate a structure as illustrated in FIG. 2. Referring to FIG. 3A, the substrate of p-type semiconductivity 50 is illustrated with a diffusion mask

**51*a* disposed on one of the major surfaces thereof so as to provide openings for the diffusion of an n+ type impurity into the substrate surface. Upon the diffusion of an n-type impurity the regions 86 and 88** are formed. These regions are sometimes referred to as buried regions since they are subsequently covered by an epitaxial layer.

Figure 3B:
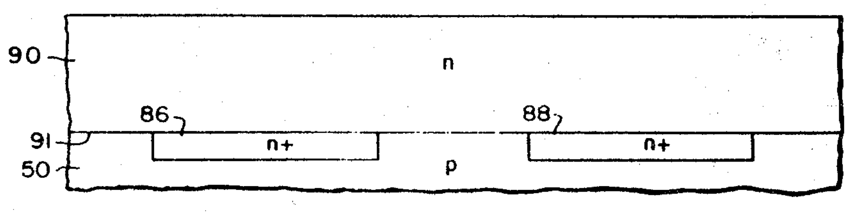

FIG. 3B illustrates the structure after there has been formed over the major surface of the substrate 50 an n-type layer 90, by epitaxial growth, forming a junction 91 with the substrate.

Figure 3C:
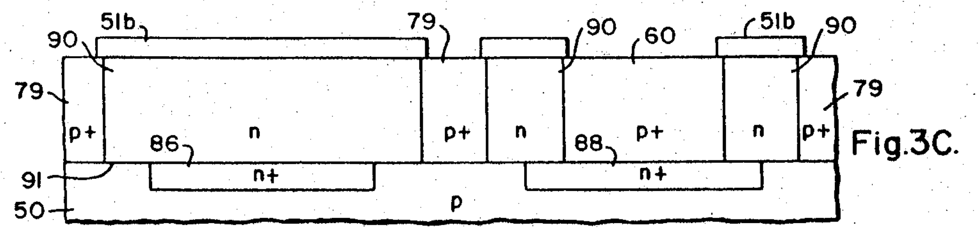

FIG. 3C illustrates the structure after a selective diffusion through a diffusion mask **51*b* has been performed to produce p+ regions 79 and 60 where the regions 79 are for isolation of portions of the n-type layer 90 and the region 60** is for the anode of the diode structure.

Figure 3D:
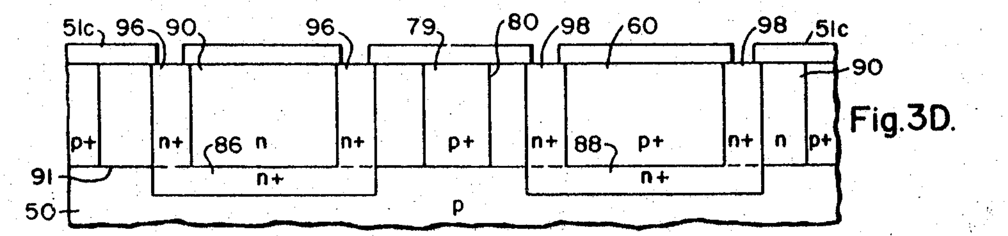

FIG. 3D illustrates the structure after another selective diffusion has been performed through diffusion mask **51*c* of a donor impurity to form the n+ regions 96 and 98, each being in the form of a ring extending through the n-type layer 90**.

Figure 3E:
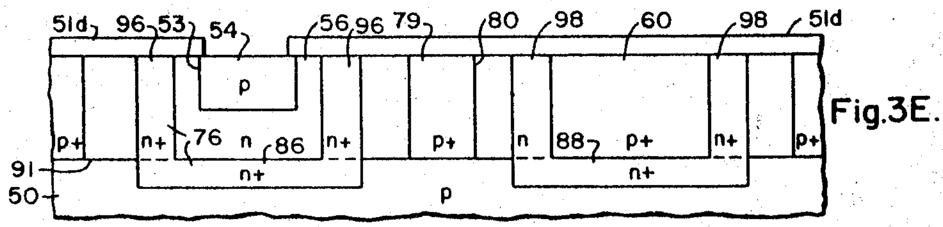

FIG. 3E illustrates the structure after another selective diffusion has been performed through an oxide mask **51*d* with an acceptor impurity to form the region 54 within the portion of the n-type layer 90 enclosed by the n+ wall 96 thus forming the region 56 as illustrated in FIG. 2. The n+ regions 86 and 96 cooperate to provide the region 76** as illustrated in FIG. 3E and in FIG. 2.

Figure 3F:
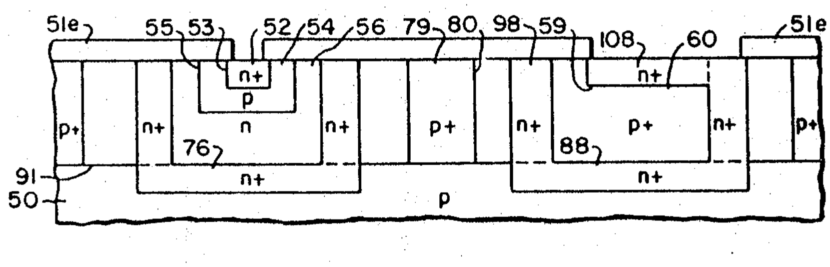

FIG. 3F illutrates the structure after further selective diffusion has been performed through a diffusion mask **51*e* with a donor impurity to form the regions 52 and 108. This diffusion completes the formation of the regions of the structure illustrated in FIG. 2 with the diffused regions 88, 98 and 108 cooperating to provide the region 58** that is the diode-cathode.

Figure 3G:
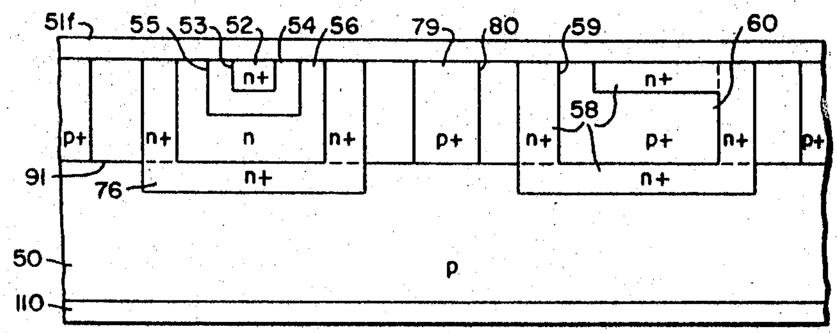

FIG. 3G illustrates the structure after an oxide layer **51*f*** has been formed completely over the major surface in which the diffusion operations are performed and a layer of metal of at least one metal of the group consisting of gold, copper, iron and manganese is disposed on the opposite major surface. For example, a layer of gold may be formed by a vacuum evaporation for this purpose. The structure is heated to diffuse the metal throughout the structure so that it penetrates all parts thereof.

Figure 4:
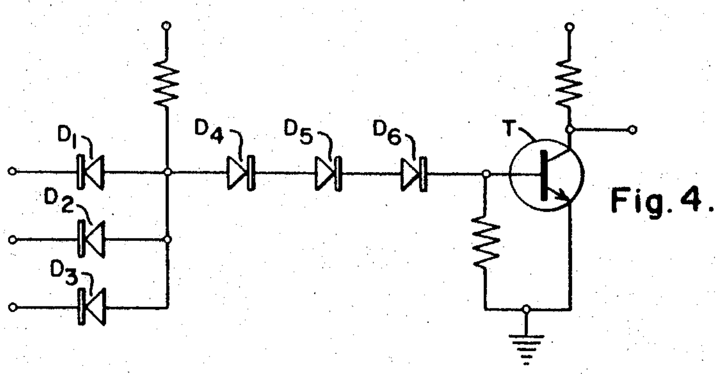
FIG. 4 is a circuit schematic illustrating a typical circuit that has been successfully and advantageously integrated within a single body of semiconductor material in accordance with the teachings of the present invention.

FIG. 4 illustrates a circuit that has been integrated in accordance with the techniques of the present invention. This circuit is of the type known as a diode-transistor logic circuit (often referred to as DTL) and performs a NAND logic function. The diodes $D_1$, $D_2$ and $D_3$ are representative of the plurality of input diodes, each having a fast recovery, that may be used in the circuit. The diodes $D_4$, $D_5$ and $D_6$ are representative of diodes, each having a slow recovery, used in the base circuit of the fast switching transistor, T. It will be understood that the fast recovery diodes may be, and preferably are, formed as shown in FIG. 1.

The circuit of FIG. 4 was integrated as described in connection with FIGS. 2 and 3A to 3G with the substrate 50 of p-type silicon having a thickness of about 8 mils and a resistivity of about 20 ohm-centimeters. The epitaxial layer 90 was grown by the thermal reduction of silicon tetrachloride by hydrogen with a phosphorus impurity included in the reactants to provide a resistivity of about 0.4 ohm-centimeter in a layer having a thickness of about 10 microns. The floating collector regions 86 and 88 were diffused using phosphorus impurity to a sheet resistivity of approximately 50 ohms per square and a depth of about 3 microns.

The p-type diffusion for the regions 79 and 60 was performed using a boron impurity and diffusing to a surface concentration of approximately $10^{20}$ atoms per cubic centimeter and a sheet resistivity of about 5 ohms per square sufficient so that the diffusion front reaches the diffused regions 88 and 86. Similarly, phosphorus was diffused for the regions 96 and 98 to a surface concentration of about $10^{21}$ atoms per cubic centimeter, boron was diffused for the transistor base 54 to a surface concentration of about $10^{18}$ atoms per cubic centimeter and phosphorus was diffused for the regions 52 and 108 to a surface concentration of about $10^{21}$ atoms per cubic centimeter. In each case the diffusion masks were of silicon dioxide produced by conventional photoresist and etching techniques.

In these devices the following improvements were obtained compared with devices using conventional diodes as in FIG. 1. Turn on time was reduced from 13 nanoseconds to 7 nanoseconds. Turn off time was reduced from 40 nanoseconds to 11 nanoseconds. The new diode structures had a capacitance of 1.5 picofarads per square mil compared with 0.5 picofarad per square mil in the prior structures.

Figure 5:
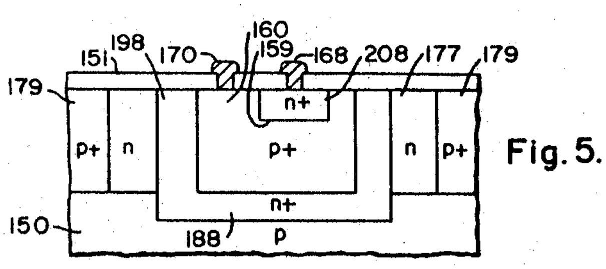
FIGS. 5 and 6 are partial, cross-sectional views of alternative diode structures in accordance with this invention.

FIG. 5 illustrates an alternative diode structure in accordance with this invention, the elements of which are designated by reference numerals having the same last two digits as those of the structure illustrated in FIGS. 2 and 3A to 3G. The structure of FIG. 5 is the same as that previously described except that the diode junction 159 is formed only between the regions 208 and 160. Because of the gradient of diffused impurities in region 160, the most highly doped portion is adjacent region 208. The slight loss in capacitance by this structure is not significant. It has been found however that this structure results in sharper forward diode characteristics so that the structure has better noise immunity.

Figure 6:
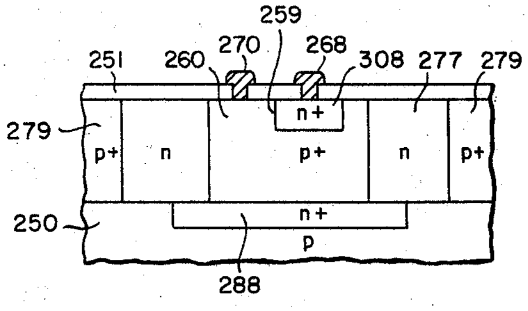

FIGURE 6 illustrates another diode embodiment in accordance with the invention, the elements of which are designated by reference numerals having the same last two digits as corresponding elements of the previous structures. The structure of FIG. 6 is the same as that previously described, e.g., in FIG. 5, except that no $n+$ wall surrounds the region 260. This embodiment is preferred where it is desired to minimize processing operations while still providing a diode structure of the two highly doped regions 260 and 308. Upon gold diffusion, some slight additional gold will enter the structure, compared with the previous structures, and may affect its characteristics but only to such a limited extent that significant improvement over the performance of prior art diode structures is still provided.

While the present invention has been shown and described in a few forms only, it will be appreciated that various changes and modifications may be made without departing from the spirit and scope thereof.

What is claimed is:

1. A semiconductor structure for performing capacitor or diode functions, and suitable for fabrication in an integrated circuit, comprising: a substrate of a first type of semiconductivity, said substrate having opposite major surfaces; a first region of a second type of semiconductivity in a portion of a first of said major surfaces; a second region of said second type on said first major surface and having higher resistivity than said first region; said substrate being in p-n junction relation with both said first and second regions; a third region of said first type on said first region and surrounded by said second region; a fourth region of said second type over only a portion of said third region; said third region being in p-n junction relation with each of said first, second and fourth regions.

2. A semiconductor structure in accordance with claim 1 wherein: said substrate has a major surface area greater than that required by said first and second regions to serve as a support for structures for providing the functions of other electronic components; a fifth region of said first type on said substrate, said fifth region surrounding and in p-n junction relation with said second region; a sixth region of said second type on said substrate separated from said second region at least by said fifth region; a seventh region of said first type within and enclosed by said sixth region in p-n junction relation therewith; an eighth region of said second type within and in p-n junction relation with said seventh region, said sixth, seventh and eighth regions cooperating to form a transistor structure; said third region and said fifth region having a like resistivity that is at least about an order of magnitude higher than that of said seventh region.

3. In a semiconductor integrated circuit, the structure comprising: a substrate of a first type of semiconductivity; an epitaxial layer of a second type of semiconductivity on said substrate; an isolation wall of said first type of semiconductivity extending through said layer to said substrate and isolating said layer into a plurality of portions; a buried region of said second type of semiconductivity disposed in said substrate under a first of said layer portions and having lower resistivity than said layer portion; a first diode region of said first semiconductivity type extending through said layer to said buried region and having the same resistivity and impurity concentration gradient as said isolation wall; a second diode region of said second conductivity type disposed on said first diode region; ohmic contacts on each of said first and second diode regions.

4. The subject matter of claim 3, wherein: simultaneously with the diffusing to form said second region there is diffused into portions of said first major surface additional impurity capable of imparting said first type of semiconductivity to form a diffused isolation wall extending to said substrate between isolated portions of said layer of which one isolated portion surrounds said second region.

5. The subject matter of claim 4, wherein: simultaneously with the diffusing to form said first region there is diffused into another portion of said first major surface additional impurity capable of imparting said second type of semiconductivity to form a fourth diffused region of said second type; after the diffusing of said second region and said isolation wall, another isolated portion of said layer is located over said fourth region and an impurity capable of imparting said first type of semiconductivity is diffused in said other isolated portion of said layer over said fourth region to form a fifth diffused region of said first type extending less than the thickness of said layer; simultaneously with the diffusing to form said third region there is diffused into said fifth region and also into said layer portion over said fourth region and spaced from said fifth region additional impurity capable of imparting said second type of semiconductivity to form sixth and seventh diffused regions; and simultaneously with the affixing of electrical contacts to said second and third regions contacts are affixed to said fifth, sixth and seventh regions thereby providing a transistor integrated with the diode formed by said second and third regions.

6. The subject matter of claim 5, wherein: said additional region and said second diode region are unconnected.

7. The subject matter of claim 5, wherein: said additional region and said second diode region are connected.

References Cited

UNITED STATES PATENTS

| | | | |
|---|---|---|---|
| 3,094,633 | 6/1963 | Harries | 317—234 |
| 3,260,902 | 7/1966 | Porter | 317—235 |
| 3,283,170 | 11/1966 | Buie | 317—235 |
| 3,312,882 | 4/1967 | Pollock | 317—235 |
| 3,320,485 | 5/1967 | Buie | 317—235 |
| 3,333,166 | 7/1967 | Hochman | 317—234 |

JOHN W. HUCKERT, *Primary Examiner.*

J. D. CRAIG, *Assistant Examiner.*

U.S. Cl. X.R.

148—187; 317—234